United States Patent
Kunishi et al.

(10) Patent No.: US 9,461,643 B2
(45) Date of Patent: *Oct. 4, 2016

(54) HIGH FREUENCY SEMICONDUCTOR SWITCH AND WIRELESS DEVICE

(71) Applicant: KABUSHIKI KAISHA TOSHIBA, Minato-ku, Tokyo (JP)

(72) Inventors: Yugo Kunishi, Kanagawa-ken (JP); Toshiki Seshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/928,879

(22) Filed: Oct. 30, 2015

(65) Prior Publication Data

US 2016/0056819 A1 Feb. 25, 2016

Related U.S. Application Data

(63) Continuation of application No. 13/931,522, filed on Jun. 28, 2013, now Pat. No. 9,209,800.

(30) Foreign Application Priority Data

Feb. 1, 2013 (JP) .................................. 2013-018606

(51) Int. Cl.
*H03K 17/693* (2006.01)
*H01L 27/12* (2006.01)
(Continued)

(52) U.S. Cl.
CPC ......... *H03K 17/693* (2013.01); *H01L 27/1203* (2013.01); *H01L 29/4232* (2013.01); *H01L 29/7831* (2013.01); *H03K 17/102* (2013.01); *H04B 1/52* (2013.01)

(58) Field of Classification Search
CPC ...................... H03K 17/04123; H03K 17/102
See application file for complete search history.

(56) References Cited

U.S. PATENT DOCUMENTS 8,170,500 B2  5/2012 Seshita et al.
8,232,827 B2  7/2012 Sagae et al.
(Continued)

FOREIGN PATENT DOCUMENTS

CN  101820088 A  9/2010
JP  08-223021  8/1996
(Continued)

OTHER PUBLICATIONS

Japanese Office Action issued on Sep. 4, 2015 in corresponding Japanese Application No. 2013-018606, along with English translation thereof.
(Continued)

*Primary Examiner* — Tuan H Nguyen
(74) *Attorney, Agent, or Firm* — White & Case LLP

(57) ABSTRACT

A high frequency semiconductor switch has a first terminal, second terminals, a first through FET group, second through FET groups and a shunt FET group. The first through FET group has first field effect transistors connected serially with each other. One end of the first through FET group is connected to the first terminal. Each of the second through FET groups has second field effect transistors connected serially with each other. One end of each of the second through FET groups is connected to each of the second terminals. The other end of each of the second through FET groups is commonly connected to the other end of the first through FET group. The shunt FET group has third field effect transistors connected serially with each other between the second terminal and a ground terminal.

9 Claims, 7 Drawing Sheets

(51) Int. Cl.
  *H03K 17/10* (2006.01)
  *H01L 29/423* (2006.01)
  *H01L 29/78* (2006.01)
  *H04B 1/52* (2015.01)

(56) References Cited

U.S. PATENT DOCUMENTS

| | | |
|---|---|---|
| 2005/0017778 A1 | 1/2005 | Nogawa et al. |
| 2007/0103252 A1 | 5/2007 | Nakatsuka et al. |
| 2009/0033435 A1 | 2/2009 | Otani et al. |
| 2011/0050288 A1 | 3/2011 | Sagae et al. |
| 2012/0068757 A1 | 3/2012 | Seshita et al. |
| 2012/0139570 A1 | 6/2012 | Sugawara et al. |
| 2012/0153396 A1 | 6/2012 | Sugiura et al. |

FOREIGN PATENT DOCUMENTS

| | | |
|---|---|---|
| JP | 2000-294786 | 10/2000 |
| JP | 2005-515657 A | 5/2005 |
| JP | 2006303775 A | 11/2006 |
| JP | 2007-129571 A | 5/2007 |
| JP | 2009-038500 A | 2/2009 |
| JP | 2010-028304 | 2/2010 |
| JP | 2012-134317 A | 7/2012 |
| WO | 03/032431 A2 | 4/2003 |

OTHER PUBLICATIONS

Japanese Office Action issued on Mar. 25, 2016 in corresponding Japanese Application No. 2013-018606, along with English translation thereof.

Chinese Office Action issued on Jun. 3, 2016 in Chinese patent application No. 201310351389.X, along with English translation thereof.

HIGH FREUENCY SEMICONDUCTOR SWITCH AND WIRELESS DEVICE

CROSS-REFERENCE TO RELATED APPLICATION

This application is a continuation of application Ser. No. 13/931,522, filed Jun. 28, 2013 and is based upon and claims the benefit of priority from the prior Japanese Patent Application No. 2013-018606, filed on Feb. 1, 2013, the entire contents of each are incorporated herein by reference.

FIELD

Embodiments described herein generally relate to a high frequency semiconductor switch and a wireless device.

BACKGROUND

A high frequency semiconductor switch having MOSFETs formed on an SOI (Silicon On Insulator) substrate has been utilized in a wireless device such as a cellar phone in order to connect between an antenna and transmitting and receiving circuits.

Recent years, a high frequency semiconductor switch with a multi-port has been developed so as to address widening of a communication frequency band or increase of number of communication standards. Accordingly, an SPnT (Single-Pole n-Throw) switch with one-input and n-output has been used as a frequency semiconductor switch.

The SPnT switch has through FET groups and shunt FET groups. Each of the through FET groups has n pieces of FETs. Each of the through FET groups is connected between an antenna terminal and respective ports. Each of the shunt FET groups is connected between the respective ports and a ground terminal.

Only one of the through FET groups is set in a conductive state and the others are set in a non-conductive state, in the SPnT switch. Thus, the number of through FET groups in an off-state is increased with increase of the number of ports which are provided according to introduction of a multi-port. As a result, the off-capacitance of the SPnT switch is increased so that insertion loss has increasing tendency. A circuit for decreasing off-capacitance and decreasing insertion loss is proposed. In this circuit, decrease of off-capacitance is attained by connecting a common through FET group to one ends of a plurality of through FET groups. However, according to the circuit, when the plurality of the through FET groups are in a non-conductive state, a voltage to be applied between a source and a drain of each FET of the common through FET group becomes high, resulting in increasing distortion current.

Furthermore, the distortion current generated by the off-capacitance is increased in the through FET groups when a voltage applied to the through FET groups in a non-conductive state is high.

DETAILED DESCRIPTION

Figure 1:
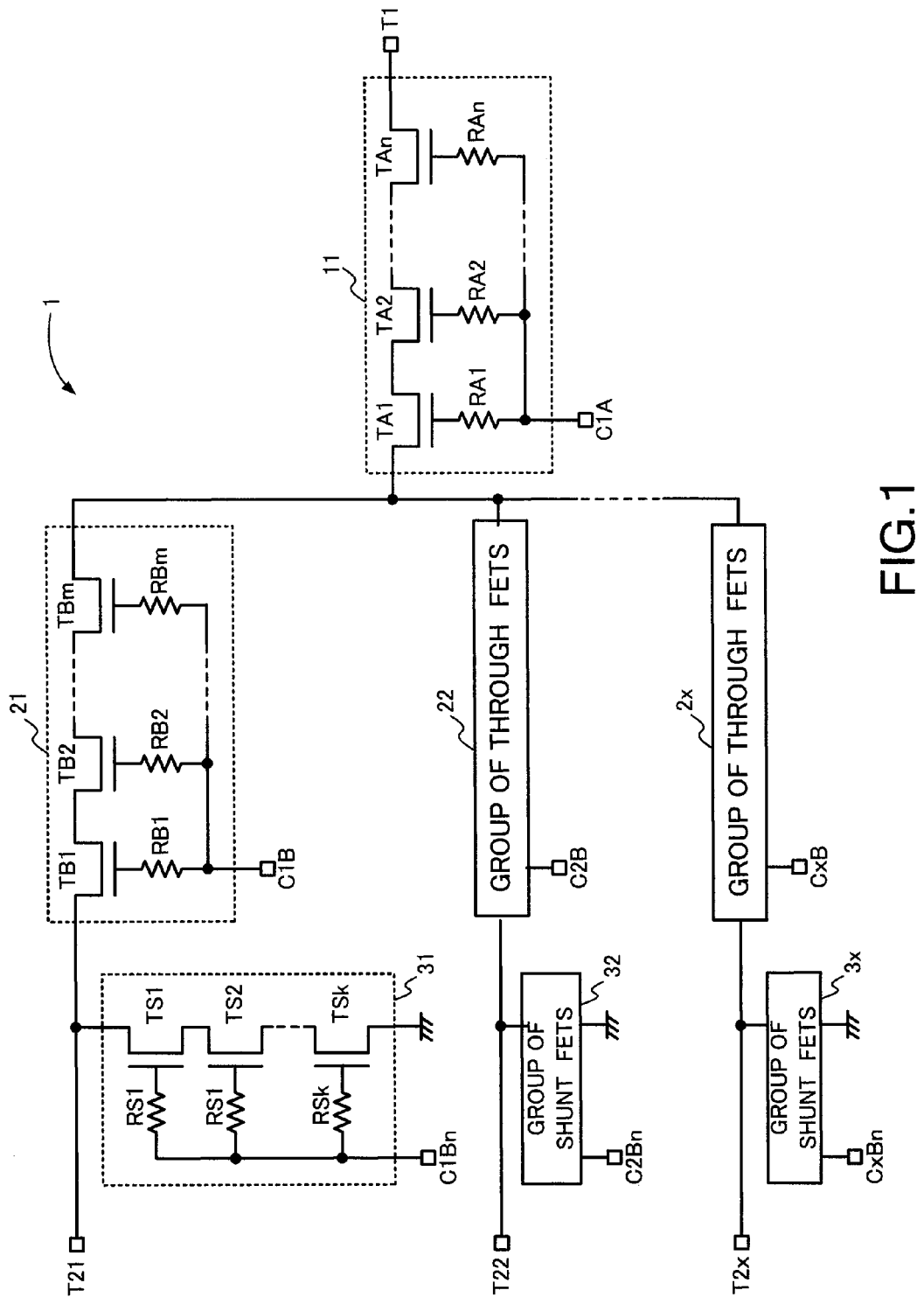
FIG. 1 is a circuit diagram showing a configuration of a high frequency semiconductor switch according to an embodiment.

According to one embodiment, a high frequency semiconductor switch which has a first terminal, a plurality of second terminals, a first through FET group, a plurality of second through FET groups and a shunt FET group is provided. The first through FET group has a plurality of first field effect transistors connected serially with each other. One end of the first through FET group is connected to the first terminal. Each of the second through FET groups has a plurality of second field effect transistors connected serially with each other. One end of each of the second through FET groups is connected to each of the second terminals. The other end of each of the second through FET groups is commonly connected to the other end of the first through FET group. The shunt FET group has a plurality of third field effect transistors connected serially with each other between the second terminal and a ground terminal.

In the case where n is a number of the first field effect transistors of the first through FET, m is a number of the second field effect transistors of each of the second through FET groups, and x is a number of the through FET groups, the number m of the second field effect transistors is selected such that a voltage between a source and a drain of each of the second field effect transistors is not greater than a breakdown voltage of the second field effect transistors when the first through FET group is in a conductive state and the second through FET groups are not in a conductive state, and the number n of the first field effect transistors is selected based on the number m and the number x, such that a voltage between a source and a drain of each of the first field effect transistors is not greater than a breakdown voltage of the first field effect transistors when the first through FET group and the second through FET groups are not in a conductive state.

Hereinafter, further embodiments will be described with reference to the drawings. In the drawings, the same reference numerals denote the same or similar portions respectively.

FIG. 1 is a circuit diagram showing a configuration of a high frequency semiconductor switch according to an embodiment.

A high frequency semiconductor switch 1 according to the embodiment includes a first terminal T1, x pieces of second terminals T21-T2$x$, a through FET group 11 as a first through FET group, x through FET groups 21-2$x$ as second through FET groups, and x shunt FET groups 31-3$x$. "x" is a number.

A high frequency signal is inputted to the first terminal T1 or outputted from the first terminal T1. A high frequency signal is inputted or outputted to the second terminal T2. The through FET group 11 has n pieces of field effect transistors (hereinafter referred to as "MOSFET") TA1-TAn which are connected with each other serially. One end of the through FET group 11 is connected to the first terminal T1.

Each of the through FET groups 21-2x has m pieces of MOSFETs TB1-TBm which are connected with each other serially. One end of each of the through FET groups 21-2x is connected to each of the second terminals T21-T2x. The other end of each of the through FET groups 21-2x is commonly connected to the other end of the through FET group 11. Each of the shunt FET groups 31-3x has k pieces of MOSFETs which are connected with each other serially. Each of the shunt FET groups 31-3x is connected between each of the second terminals T21-T2x and a ground terminal. k, x, m and n are a positive integer.

In the high frequency semiconductor switch 1 of the embodiment, a dual-step structure composed of the through FET group 11 and the through FET groups 21-2x is connected between the first terminal T1 and each of the second terminals T21-T2x.

The through FET group 11 is provided with n pieces of MOSFETs TA1 to Tan which are serially connected with each other. A switch control signal C1A is inputted to gate terminals of the MOSFETs TA1-TAn via resistances RA1-RAn. Conduction or non- conduction of the MOSFETs TA1-TAn is controlled by the switch control signal C1A.

Each of the through FET groups 21-2x is provided with m pieces of MOSFTs TB1-TBm. A switch control signal C1B is inputted to gate terminals of the MOSFTs TB1-TBm via resistances RB1-RBm. Conduction or non-conduction of the MOSFETs TB1-TBm are controlled by the switch control signal C1B.

Each of the shunt FET group 31-3x is provided with k pieces of MOSFETs TS1-TSk which are serially connected with each other. A switch control signal C1Bn is inputted to gate terminals of the MOSFETs TS1-TSk via resistances RS1-RSk. The switch control signal C1Bn is a polarity reverse signal of the switch control signal C1B. Conduction or non- conduction of the MOSFETs TS1-TSk are controlled by the switch control signal C1Bn.

A fully-depleted MOSFET which is formed on an SOI (Silicon On Insulator) layer is desirably used for the MOSFETs. It is because, when a resistor having a high resistance value is connected to a gate terminal of a MOSFET, a source and a drain of the MOSFET lose their polarity so that generation of even-ordered distortion can be prevented in principle. A back gate of each of the MOSFETs may be set in an electrically-floating state. Alternatively, the back gate of each of the MOSFETs may be controlled electrically by applying a voltage to the back gate.

Figure 2:
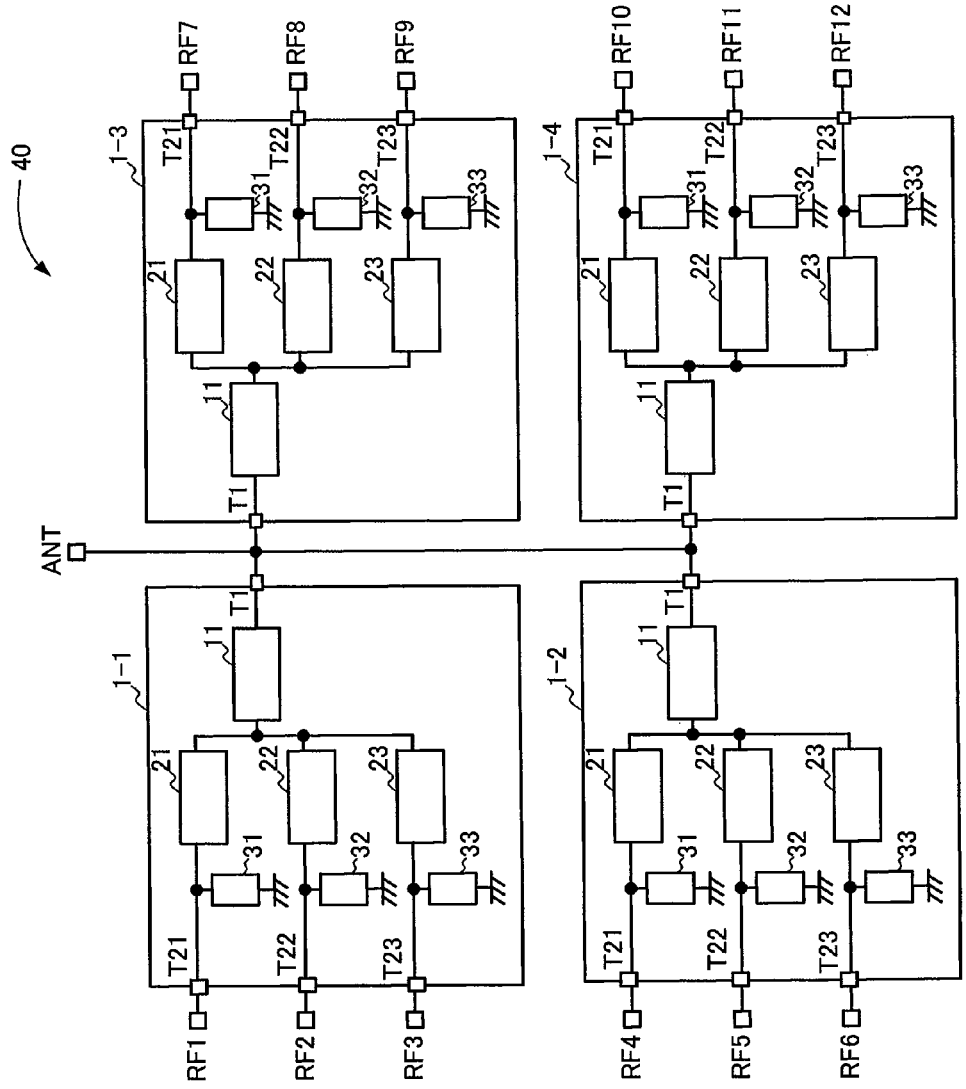
FIG. 2 is a circuit diagram showing a configuration of an SP12T switch using the high frequency semiconductor switch.

A configuration example of an SP12T (Single-Pole 12-Throw) switch 40, is shown in FIG. 2. The configuration example uses four high frequency semiconductor switches 1-1 to 1-4 which have the same configuration as the high frequency semiconductor switch 1. In the configuration example, the number x of second terminals of each of the high frequency semiconductor switches is three (x=3).

First terminals T1 of the high frequency semiconductor switches 1-1 to 1-4 are commonly connected to an antenna terminal ANT. The second terminals T21 to T23 of the high frequency semiconductor switch 1-1 are respectively connected to terminals RF1-RF3. The second terminals T21 to T23 of the high frequency semiconductor switch 1-2 are respectively connected to each of terminals RF4-RF6. The second terminals T21 to T23 of the high frequency semiconductor switch 1-3 are respectively connected to terminals RF7-RF9. The second terminals T21 to T23 of the high frequency semiconductor switch 1-4 are respectively connected to terminals RF10-RF12.

In the example of FIG. 2, in order to give conduction between the terminal ANT and the terminal RF1, for example, the through FET group 11 and the through FET group 21 of the high frequency semiconductor switch 1-1 are electrically conducted and the shunt FET group 31 of the high frequency semiconductor switch 1-1 is not electrically conducted. The through FET groups 22, 23 of the high frequency semiconductor switch 1-1 are not electrically conducted and the shunt FET groups 32, 33 of the high frequency semiconductor switch 1-1 are electrically conducted.

In each of the high frequency semiconductor switches 1-2 to 1-4, the through FET group 11 and the through FET groups 21-23 are not electrically conducted and the shunt FET groups 31-33 are electrically conducted.

Figure 3:
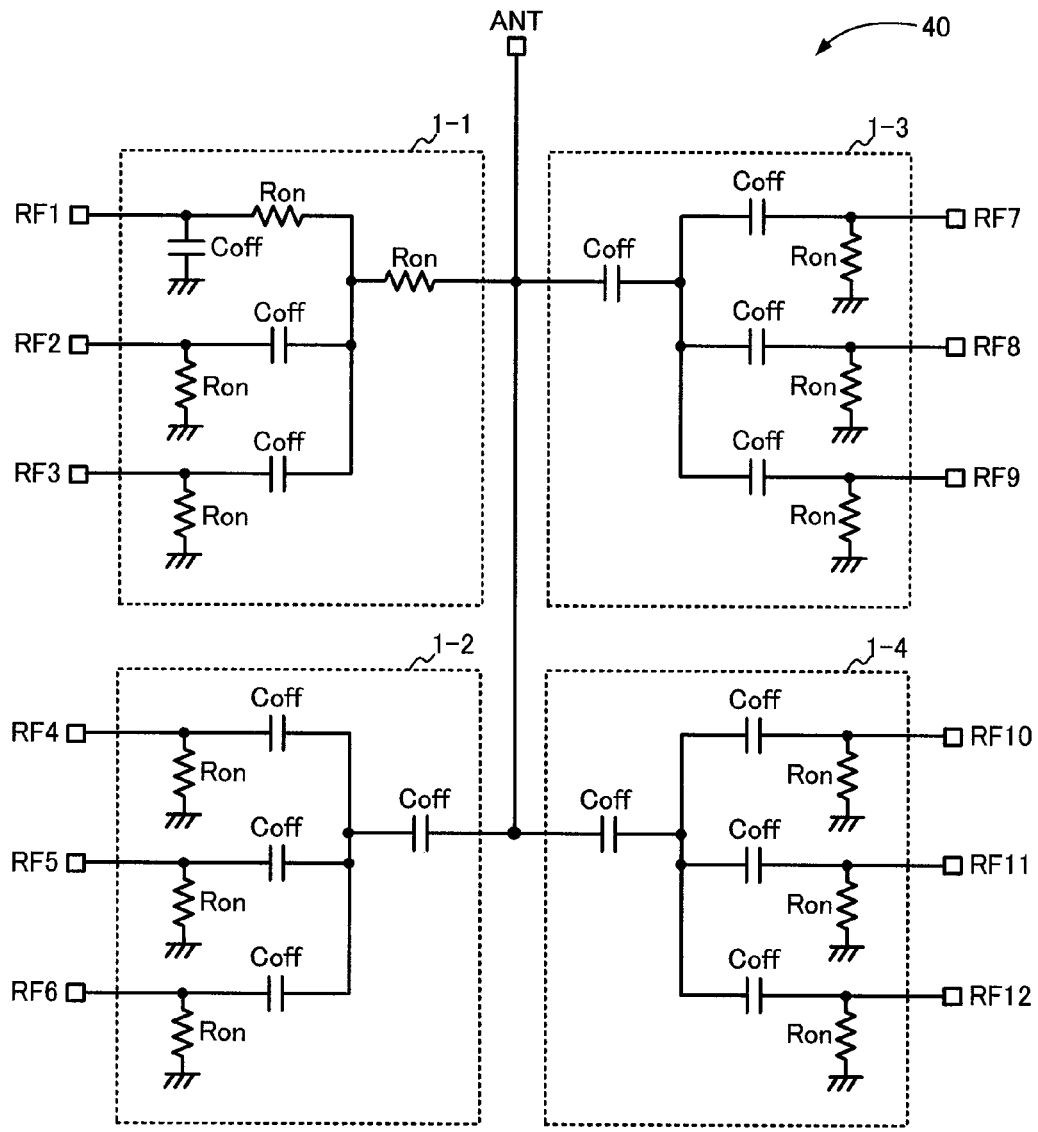
FIG. 3 is an electrically equivalent circuit diagram in a conductive state between a terminal ANT and a terminal RF1 of the SP12T switch of FIG. 2.

FIG. 3 is an electrically equivalent circuit diagram of the SP12T switch 40. The FET groups which are in a conductive state are represented as Ron, and the FET groups which are in a non-conductive state are represented as Coff.

In this case, since the embodiment has a dual-step structure of the through FET groups 11 and the through FET group 21-23, an off-capacitance of the through FET group 11 and off-capacitances of the through FET groups 21-23 are serially connected with each other in the high frequency semiconductor switches 1-2 to 1-4.

Thus, in a case where the off-capacitances of the through FET group 11 and the through FET groups 21-23 are equal, for example, the total off-capacitance including the through FET group 11 and the through FET groups 21-23 is 0.75 Coff. Accordingly, the entire off-capacitance of the SP12T switch 40 is 4.25 Coff.

On the other hand, in a case where a SP12T switch has a single-step structure of a through FET group, the entire off-capacitance of the SP12T switch is 11 Coff. The off-capacitance of the SP12T switch of the embodiment can be decreased to approximately 39% as compared to that of the SP12T switch having the single-step structure of the through FET group.

In a switch with multiple ports, when a total off-capacitance is large, a reflection loss is increased and an insertion loss in a frequency band over 2 GHz is largely increased. However, in the embodiment, the total off-capacitance can be decrease as described above so that the insertion loss in the frequency band over 2 GHz can be significantly decreased.

In such a manner, the insertion loss is decreased with decrease of the off-capacitances of the through FET group 11 and the through FET group 21-23. The off-capacitances are decreased with decrease of a gate width WgA of each of the MOSFETs TA1-TAn of the through FET group 11 and a gate width WgB of each of the MOSFETs of the through FET groups 21-23. However, on-resistances of the through FET group 11 and the through FET group 21-23 are increased with decrease of the gate widths WgA, WgB. A propagation loss of the SP12T switch 40 is increased with increase of the on-resistances.

In a cellar phone, an electric power inputted into a RF port is, for example, 35 dB which is a large value. Consequently, heat quantity to be generated in a high frequency semiconductor switch increases with increase of a propagation loss with resistive property. For example, an electric power loss is about 340 mw in a case that a propagation loss is 0.5 dB.

In contrast, an electrical power loss is 650 mw in a case that a propagation loss is 1.0 dB. As an electrical power loss is larger, an insertion loss and distortion characteristics of a switch are deteriorated.

In order to prevent the deterioration, the gate width WgA of the MOSFETs TA1-TAn of the through FET group 11 and the gate width WgB of the MOSFETs TB1-TBm of the through FET groups 21-23 can not be set below a predetermined value. The gate widths WgA, WgB are desirably set to the same value (WgA=WgB) substantially.

According to the high frequency semiconductor switch 1 of the embodiment, the off-distortion can be suppressed to a level equal to or below a desired level with reduction of the insertion loss described above. The reduction of the insertion loss is attained by selecting the number n of the MOSFETs of the through FET groups 21-23 and the number n of the MOSFETs of the through FET group 11 suitably.

Selecting of the number n of the MOSFETs of the through FET groups 21-23 and the number n of the MOSFETs of the through FET group 11 in order to suppress the off-distortion to a level equal to or below the desired level will be specifically described below.

Selecting of the number m of the MOSFETs of the through FET groups 21-23 will be described with reference to FIG. 4.

Figure 4:
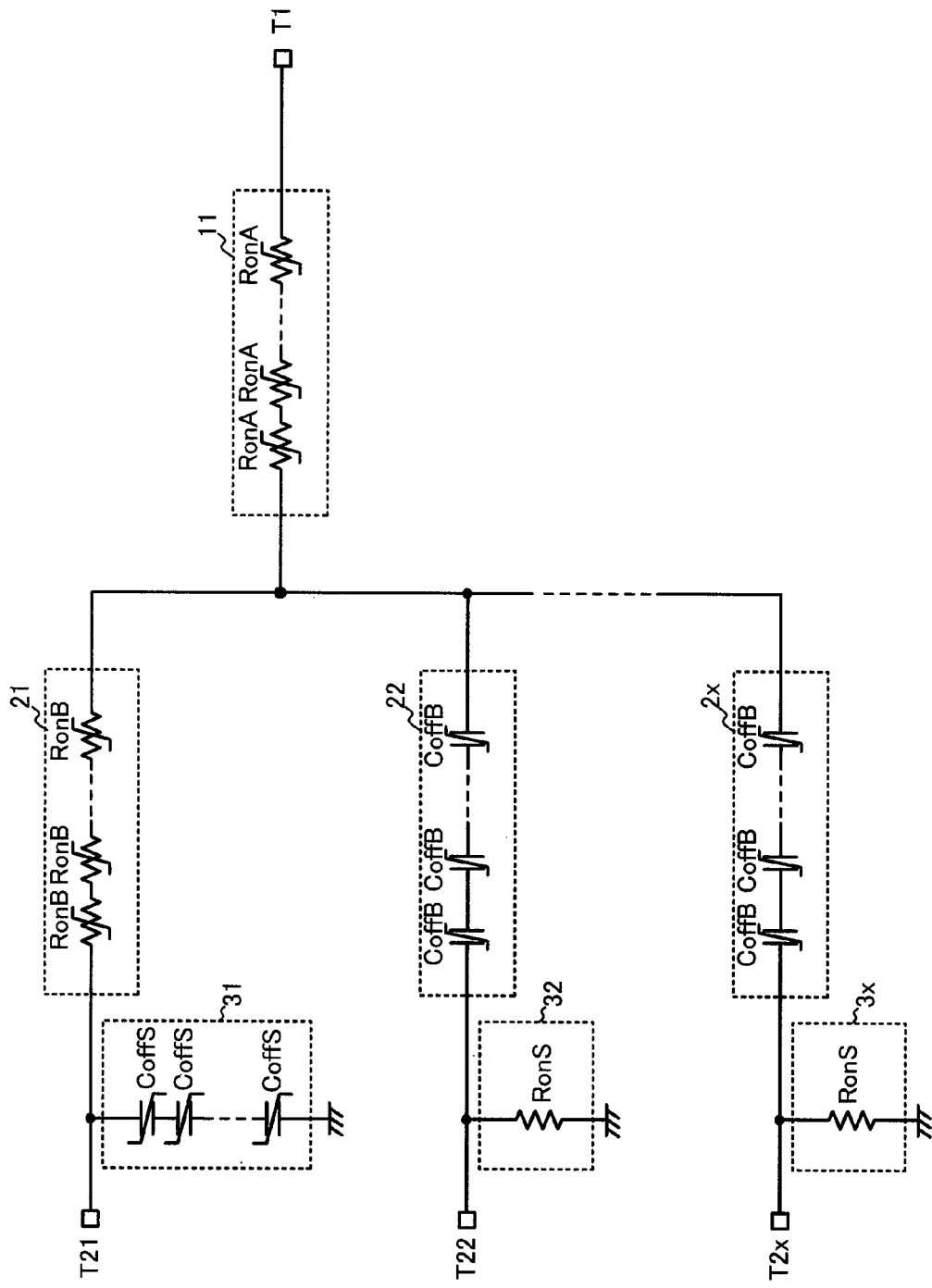
FIG. 4 is an electrical equivalent circuit diagram in a conductive state between a terminal T1 and a terminal T21 of the high frequency semiconductor switch.

FIG. 4 is an electrically equivalent circuit diagram of the high frequency semiconductor switch 1 at a time when conduction is given between the terminal T1 and the terminal T21.

In this case, the MOSFETs TB1-TBm of the through FET group 21 of FIG. 1, which are connected to the terminal T21, are respectively represented by non-linear resistances RonB. The MOSFETs TA1-TAn of the through FET group 11 of FIG. 1 are respectively represented by non-linear resistances RonA. The MOSFETs TS1-TSk of the shunt FET group 31 of FIG. 1, which are connected to the terminal T21, are represented by non-linear capacitances CoffS.

On the other hand, the MOSFETs TB1-TBm of the through FET group 22-2$x$ of FIG. 1 which are connected to the terminal T22-T2$x$ are respectively represented by non-linear capacitances CofB. The MOSFETs TS1-TSk of the shunt FET groups 32-3$x$ are represented by linear resistances RonS, because the voltage amplitude arising at an off-port is extremely small.

In such the case, a voltage which is equal to a voltage Vin to be inputted to the terminal T21 is applied to the through FET groups 22-2$x$ connected to terminals T22-T2$x$, since the terminals T22-T2$x$ are connected to ground potential through the shunt FET groups 32-3$x$.

At this time, the through FET groups 22-2$x$ need to maintain a cut-off state when a high frequency signal is inputted and to suppress the off-distortion to be equal to or below a required level, 70 dBc, for example. Thus, it is necessary that a voltage VdsB to be applied between a source and a drain of each of the MOSFETs TB1-TBm of the through FET groups 21 of FIG. 1 is set to be smaller than a breakdown voltage Vbk. Accordingly, it is necessary to set the voltage VdsB equal to y·Vbk (0<y<1).

Since the voltage Vbk is equal to a voltage Vin/m, the voltage Vin/m is represented as Vin/m=y·Vbk. Accordingly, it is necessary that the number m of the MOSFETs of each of the through FET groups 21-2$x$ is selected as m=Vin/(y·Vbk).

In case of a cellar phone, for example, the electrical power inputted to the terminal T21 is 35 dBm at a maximum, and a half width of the voltage amplitude becomes 17.78V when the characteristic impedance is 50Ω. Furthermore, the input voltage Vin is estimated to be 26.6v when impedance variation of an antenna is taken into consideration.

A breakdown voltage Vbk of a back-gate floating type MOSFET is nearly equal to 2.5V where a thickness of a gate oxide film of the MOSFET is 9 nm, a gate length of the MOSFET is 0.25 μm, and a threshold voltage of the MOSFET is zero V.

The number m of the MOSFETs of each of the through FET groups 21-2$x$ can be calculated as m=14 where y=0.75.

Selecting of the number n of the MOSFETs of the through FET groups 11 will be described with reference to FIG. 5.

Figure 5:
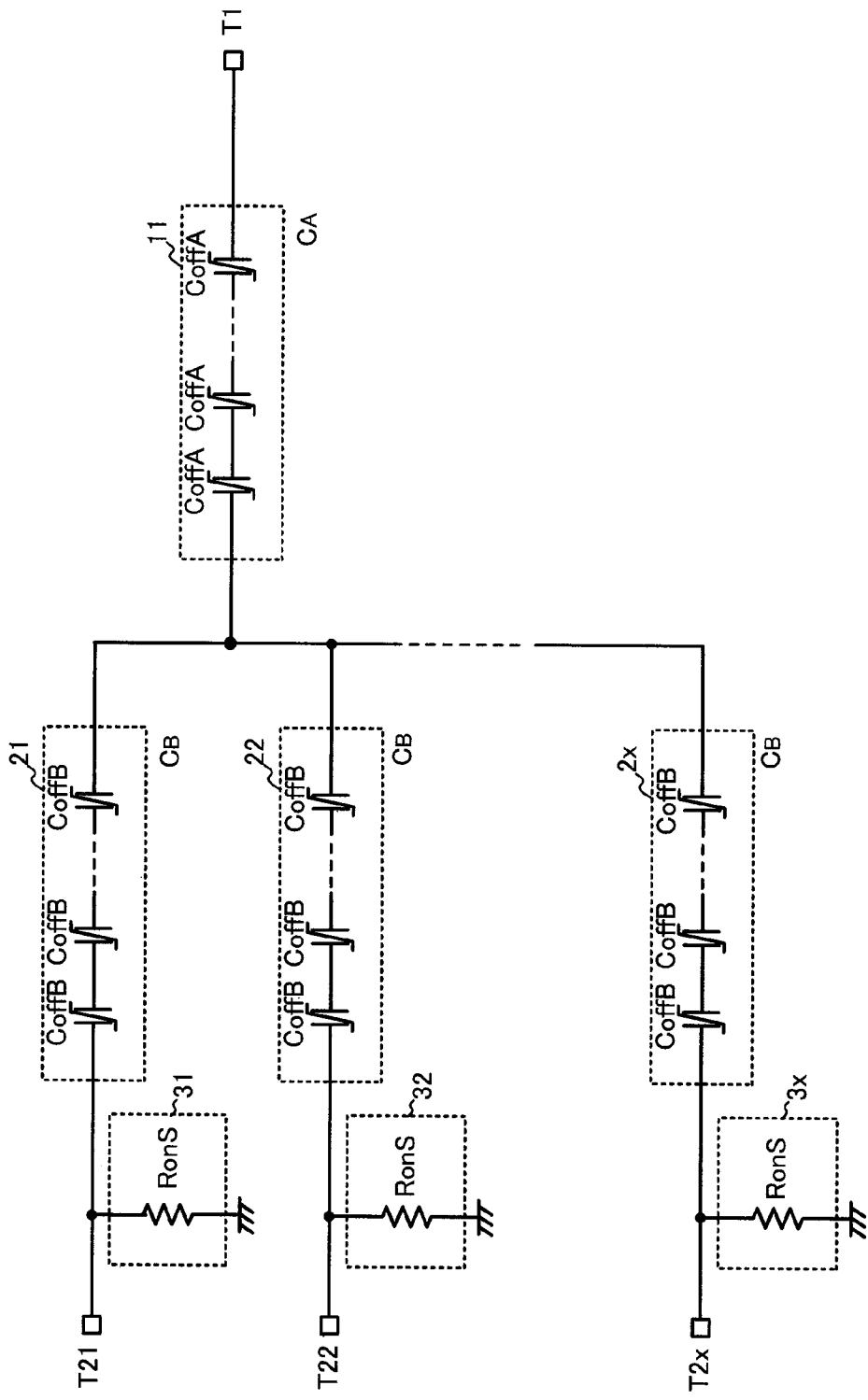
FIG. 5 is an electrical equivalent circuit diagram in a conductive state between the terminal T1 and each of terminals T21-T2$x$ of the high frequency semiconductor switch.

FIG. 5 is an electrically equivalent circuit diagram when all of the MOSFETs provided between the terminal T1 and the terminals T21-T2$x$ in the high frequency semiconductor switch are not conductive. In this case, all of the through FETs are represented as non-linear capacitances, and all of the shunt FETs are represented as linear resistances.

A voltage VA which is applied to both ends of the through FET group 11 is represented as the following equation where the voltage to be inputted to the terminal T1 is Vin, The total off-capacitance of the through FET group 11 is CA, and the total off-capacitance of the through FET groups 21-2$x$ is Cs.

$$V_A = x \cdot C_B/(C_A + x \cdot C_B) \cdot V\text{in},$$

Figure 6:
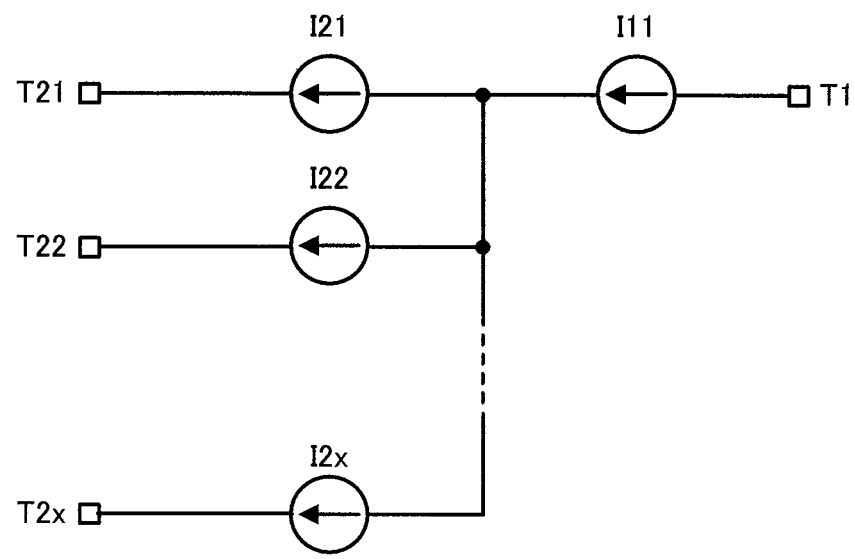
FIG. 6 is an explanatory diagram showing an off-distortion of the high frequency semiconductor switch.

FIG. 6 is an electrical equivalent circuit model obtained when only a distortion component is taken into consideration in a case that the voltage to be applied between the terminal T1 and the terminal T21-2$x$ is small comparatively.

In this case, a distortion component generated in the non-linear capacitances can be represented by a model using a current source I11 for supplying a small current, and current sources I21-I2$x$. Furthermore, only a third-ordered distortion which is the lowest distortion as the distortion component may be taken into consideration when the voltage amplitude is small.

In such a serially-connected circuit of the current source I11 and the current sources I21-I2$x$, the current value is restricted by the current source I11 for supplying the small current. Accordingly, large distortion current does not arise since any other pathway for flowing a distortion current does not exist, even if a motion of causing a large distortion current occurs in the through FET group 11.

In this case, a breakdown is generated when a voltage between a source and a drain of each of the MOSFETs of the through FET group 11 goes over a breakdown voltage. Accordingly, the MOSFET cannot be represented by a model using a capacitance.

Thus, according to the embodiment, it is necessary that a voltage VdsA is represented by the following equation where the voltage between a source and a drain of each MOSFET of the through FET group 11 is VdsA, the voltage between a source and a drain of each MOSFET of the through MOSFET groups 21-2$x$ is VdsB, and the breakdown voltage of the MOSFETs is Vbk.

$$VdsB \leq VdsA \leq Vbk,$$

Since the voltage VdsA is $V_A/n$ and the voltage Vbk is (Vin/m)/y, the voltage $V_A$ is represented as the following equation.

$$V_A \leq (n/m) \times (V\text{in}/y).$$

As described above, the voltage VA is represented as the following equation.

$$V_A = xC_B/(C_A + xC_B) \cdot V\text{in}$$

In this case, the off-capacitances $C_A$, $C_B$ are represented by the following equation where the capacitance per a unit gate width of each MOSFET is Coff, the gate width of each of the MOSFETs TA1-TA is WgA, and the gate width of each of the MOSFETs TB1-TBm of the through FET groups 21-2x is WgB, respectively.

$$C_A=(WgA/n)\cdot Coff \text{ and } C_B=(WgB/m)\cdot Coff,$$

Accordingly, it is necessary that the number n of the MOSFETs of the through FET group 11 is selected as the following equation.

$$n\geq m\cdot\{y-WgA/(x\cdot WgB)\}$$

In a case of m=14, x=3, y=0.75 and WgA=WgB, for example, it is necessary to satisfy n≥6.

By the above methodology, the number of the MOSFETs of the through FET group 11 and the number of the MOSFETs of each of the through FET groups 21 to 2x are suitably determined.

Figure 7:
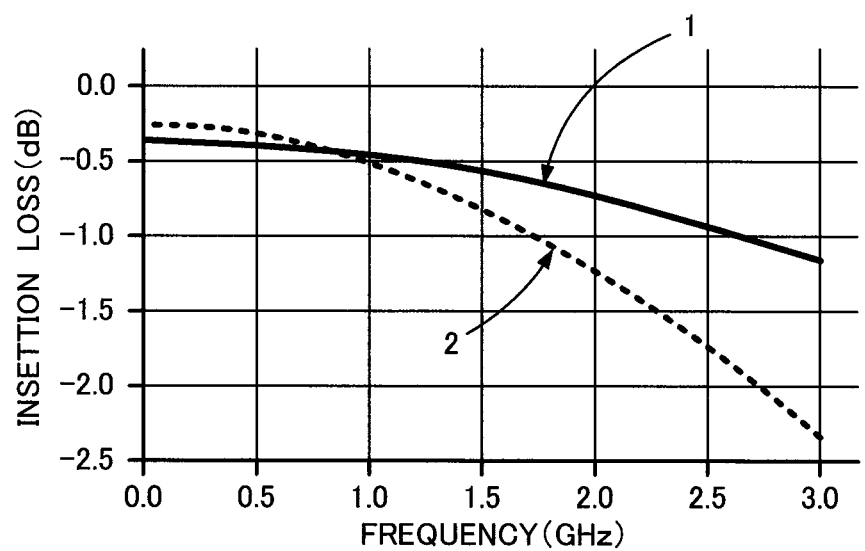
FIG. 7 is a graph illustrating frequency characteristics of insertion loss in the high frequency semiconductor switch.

FIG. 7 shows frequency characteristics of an insertion loss of a high frequency semiconductor switch in a case of m=14 and n=6. In FIG. 7, a curve line 1 indicates an example of characteristics of an insertion loss of the high frequency semiconductor switch according to the embodiment. A curve line 2 indicates a reference example of characteristics of an insertion loss in a case where a through FET group has a single-step structure.

As shown in FIG. 7, the insertion loss of the reference example is equal to or more than 1.3 dB at a frequency over 2 GHz. On the other hand, the insertion loss of the embodiment is greatly decreased to 0.8 dB at a frequency over 2 GHz.

The insertion loss is decreased and increase of off-distortion can be suppressed by suitably selecting the number of the MOSFETs of the through FET group 11 and the number of the MOSFETs of each of the through FET groups 21 to 2x, according to the embodiment.

Figure 8:
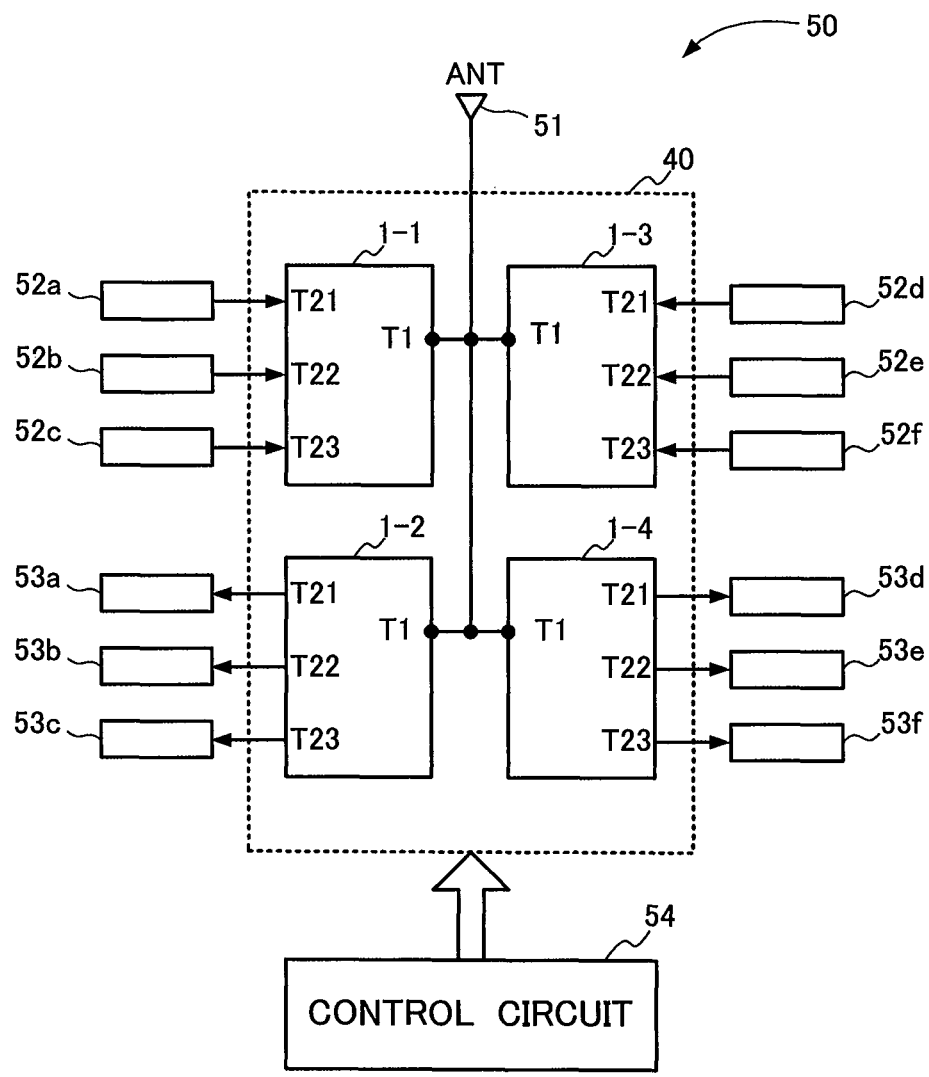
FIG. 8 is a block diagram illustrating a configuration of a wireless device including the high frequency semiconductor switch.

FIG. 8 is a block diagram showing a configuration example of a wireless device having the high frequency semiconductor switch 1 according to the embodiment.

In FIG. 8A, a wireless device 50 is provided with a SP12T switch 40, an antenna 51, transmitting circuits 52a-52f, receiving circuit 53a-53f, and a control circuit 54 for wireless control.

The SP12T switch 40 is provided with high frequency semiconductor switches 1-1 to 1-4 which have the same configuration as the high frequency semiconductor switch 1 of FIG. 1. The antenna 51 is connected to terminals T1 of the high frequency semiconductor switches 1-1 to 1-4 and transmits and receives radio waves. Each of the transmitting circuits 52a-52f is connected to each of terminals T21-T23 of the high frequency semiconductor switches 1-1 and 1-3. Each of the receiving circuits 53a-53f is connected to each of the terminals T21 to T23 of the high frequency semiconductor switches 1-2 and 1-4. The control circuit 54 provides terminal switching signals to the high frequency semiconductor switches 1-1 to 1-4.

The transmitting circuits 52a-52f modify transmitting signals and transmit modified signals to the antenna 51.

The receiving circuits 53a-53f demodulate high frequency signals received from the antenna 51.

The control circuit 54 outputs switch control signals C1A, C1B-CxB and C1Bn-CxBn which have been described with reference to FIG. 1, to each of the high frequency semiconductor switches 1-1 to 1-4 so that connections are switched between the antenna 51 and the transmitting circuits 52a-52f and the receiving circuits 53a 53f.

According to the wireless device 50 using the high frequency semiconductor switch of the embodiment, the insertion loss which arises between the antenna 51 and the transmitting circuits 52a-52f and the receiving circuits 53a-53f can be decreased, and the off-distortion can be suppressed to a level equal to or below a desired level.

Furthermore, the transmitting circuits 52a-52f and the receiving circuits 53a to 53f can be integrated to form one transmitting-receiving circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high frequency semiconductor switch, comprising:
a first terminal;
a plurality of second terminals;
a first through FET group having a plurality of first field effect transistors connected serially with each other, one end of the first through FET group being connected to the first terminal;
a plurality of second through FET groups, each of the second through FET groups having a plurality of second field effect transistors connected serially with each other, one end of each of the second through FET groups being connected to each of the second terminals, the other end of each of the second through FET groups being commonly connected to the other end of the first through FET group; and
a shunt FET group having a plurality of third field effect transistors connected serially with each other between the second terminal and a ground terminal, wherein,
in the case where n is a number of the first field effect transistors of the first through FET group,
the number n of the first field effect transistors is selected such that a voltage between a source and a drain of each of the first field effect transistors is not greater than a breakdown voltage of the first field effect transistors, when the first through FET group and the second through FET groups are not in a conductive state
wherein the number n is an integer.

2. A switch according to claim 1, wherein the gate width of each of the first field effect transistors is equal to the gate width of each of the second field effect transistors.

3. A switch according to claim 1, wherein the first field effect transistors, the second field effect transistors and the third field effect transistors are a fully-depleted MOSFETs formed on an SOI substrate, and a back gate of each of the first field effect transistors, the second field effect transistor and the third field effect transistor is set in an electrically-floating state.

4. A switch according to claim 1, wherein the first field effect transistors, the second field effect transistors and the third field effect transistors are a fully-depleted MOSFETs formed on an SOI substrate, and a back gate of each of the first field effect transistor, the second field effect transistor and the third field effect transistor is controlled electrically by applying a voltage to the back gate.

5. A switch according to claim 1, wherein at least one of the second terminals are configured to allow any of a transmitting signal and a receiving signal to pass the at least one of the second terminals.

6. A switch according to claim 1, wherein in case where m is a number of the second field effect transistors of each of the second through FET groups, and x is a number of the second through FET groups, the number m and the number x being integers, the number m of the second field effect transistors is selected such that a voltage between a source and a drain of each of the second field effect transistors is not greater than a breakdown voltage of the second field effect transistors, when the first through FET group is in a conductive state and at least one of the second through FET groups is in a conductive state.

7. A switch according to claim 6, wherein the number n is selected to satisfy the equation shown below, where y is a ratio of a maximum voltage to be applied between a source and a drain of each of the second field effect transistors to the breakdown voltage of the second field effect transistors, WgA is a gate width of each of the first field effect transistors, and WgB is a gate width of each of the second first field effect transistors.

$$n \geq m \cdot \{y - WgA/(x \cdot WgB)\}$$

8. A wireless device, comprising:
a high frequency semiconductor switch including
a first terminal,
a plurality of second terminals,
a first through FET group having a plurality of first field effect transistors connected serially with each other, one end of the first through FET group being connected to the first terminal,
a plurality of second through FET groups, each of the second through FET groups having a plurality of second field effect transistors connected serially with each other, one end of each of the second through FET groups being connected to each of the second terminals, the other end of each of the second through FET groups being commonly connected to the other end of the first through FET group, and
a shunt FET group having a plurality of third field effect transistors connected serially with each other between the second terminal and a ground terminal,
wherein, in the case where n is a number of the first field effect transistors of the first through FET group, the number n of the first field effect transistors is selected such that a voltage between a source and a drain of each of the first field effect transistors is not greater than a breakdown voltage of the first field effect transistors, when the first through FET group and the second through FET groups are not in a conductive state, and wherein the number is an integer;
an antenna connected to a first terminal of the switch and configured to transmit and receive radio waves;
a transmitting circuit connected to at least one of a plurality of second terminals of the switch to transmit a signal to the antenna;
a receiving circuit connected to at least another one of the plurality of the second terminals of the switch to demodulate a signal received from the antenna;
a wireless control circuit configured to output a switching signal to control the switch.

9. A wireless device according to claim 8, wherein the wireless control circuit is provided on the substrate on which the switch is arranged.

* * * * *